United States Patent
Makino

(10) Patent No.: US 10,672,421 B2
(45) Date of Patent: Jun. 2, 2020

(54) MAGNETORESISTIVE DEVICE WITH BIAS MAGNETIC FIELD GENERATION UNIT HAVING MAIN AND SIDE PORTIONS PARTIALLY SURROUNDING FREE LAYER PERIMETER

(71) Applicant: TDK CORPORATION, Tokyo (JP)

(72) Inventor: Kenzo Makino, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/294,206

(22) Filed: Mar. 6, 2019

(65) Prior Publication Data

US 2019/0293732 A1    Sep. 26, 2019

(30) Foreign Application Priority Data

Mar. 23, 2018 (JP) .................. 2018-056287

(51) Int. Cl.
| | |
|---|---|
| *G11B 5/39* | (2006.01) |
| *H01F 10/32* | (2006.01) |
| *G01R 33/09* | (2006.01) |
| *B82Y 25/00* | (2011.01) |
| *G11B 5/00* | (2006.01) |
| *G01R 33/00* | (2006.01) |

(52) U.S. Cl.
CPC .......... *G11B 5/3932* (2013.01); *G01R 33/093* (2013.01); *G01R 33/098* (2013.01); *H01F 10/3268* (2013.01); *B82Y 25/00* (2013.01); *G01R 33/0094* (2013.01); *G11B 5/3909* (2013.01); *G11B 2005/0008* (2013.01); *G11B 2005/3996* (2013.01)

(58) Field of Classification Search
None
See application file for complete search history.

(56) References Cited

U.S. PATENT DOCUMENTS

| | | | |
|---|---|---|---|
| 6,005,753 A | 12/1999 | Fontana, Jr. et al. | |
| 7,230,845 B1 * | 6/2007 | Wang et al. ............ | G11C 11/15 360/324.12 |
| 2003/0179520 A1* | 9/2003 | Hasegawa ............ | G11B 5/3909 360/324.12 |
| 2008/0285178 A1* | 11/2008 | Ohta et al. ........... | G11B 5/3932 360/319 |
| 2018/0144766 A1* | 5/2018 | Quan et al. .......... | G11B 5/3932 |

FOREIGN PATENT DOCUMENTS

| | | |
|---|---|---|
| JP | H05-258245 A | 10/1993 |
| WO | 2009/090739 A1 | 7/2009 |

\* cited by examiner

*Primary Examiner* — Craig A. Renner
(74) *Attorney, Agent, or Firm* — Oliff PLC

(57) ABSTRACT

A magnetoresistive device includes an MR element and a bias magnetic field generation unit. The MR element includes a free layer shaped to be long in one direction. The bias magnetic field generation unit includes a ferromagnetic layer for generating a bias magnetic field. The ferromagnetic layer includes two main portions, a first side portion, and a second side portion arranged to surround the perimeter of the free layer. In any cross section perpendicular to the longitudinal direction of the free layer, a shortest distance between the first side portion and the free layer and a shortest distance between the second side portion and the free layer are 35 nm or less.

10 Claims, 12 Drawing Sheets

MAGNETORESISTIVE DEVICE WITH BIAS MAGNETIC FIELD GENERATION UNIT HAVING MAIN AND SIDE PORTIONS PARTIALLY SURROUNDING FREE LAYER PERIMETER

BACKGROUND OF THE INVENTION

1. Field of the Invention

The present invention relates to a magnetoresistive device including a magnetoresistive element and a bias magnetic field generation unit.

2. Description of the Related Art

Magnetoresistive devices such as magnetic sensors employing magnetoresistive elements have been used for a variety of applications. Examples of the magnetoresistive elements include a spin-valve magnetoresistive element. The spin-valve magnetoresistive element includes a magnetization pinned layer having a magnetization in a fixed direction, a free layer having a magnetization whose direction is variable according to the direction of a magnetic field applied thereto, and a gap layer disposed between the magnetization pinned layer and the free layer.

In a magnetoresistive device employing a magnetoresistive element, the magnetoresistive element desirably operates in its linear region. The linear region of the magnetoresistive element refers to, in a characteristic chart showing a relationship between a magnetic field applied to the magnetoresistive element and the resistance value of the magnetoresistive element, a region where the resistance value of the magnetoresistive element varies linearly or almost linearly with respect to changes in the applied magnetic field.

Known techniques for adjusting the operation region of the magnetoresistive element so that the magnetoresistive element operates in its linear region include a technique of applying a bias magnetic field to the magnetoresistive element, and a technique of providing the free layer of the magnetoresistive element with uniaxial magnetic anisotropy such as magnetic shape anisotropy.

U.S. Pat. No. 6,005,753A, JPH05-258245A, and WO2009/090739 each disclose a device including a magnetoresistive element and a ferromagnetic layer for applying a bias magnetic field to the magnetoresistive element.

In U.S. Pat. No. 6,005,753A, the magnetoresistive element is long in one direction, and the ferromagnetic layer is provided to surround two edges of the magnetoresistive element lying at opposite ends in the longitudinal direction and one edge of the magnetoresistive element parallel to the longitudinal direction of the magnetoresistive element.

In each of JPH05-258245A and WO2009/090739, the ferromagnetic layer is disposed to surround the entire perimeter of the magnetoresistive element as viewed from above.

In the magnetoresistive element including a free layer having magnetic shape anisotropy, the magnetization direction of the free layer with no magnetic field applied thereto is set to one of two directions that are parallel to the easy axis of magnetization of the free layer and are opposite to each other. In such a magnetoresistive element, however, a reversal of the magnetization of the free layer may occur due to, for example, a disturbance magnetic field applied thereto. In a magnetic sensor employing such a magnetoresistive element, for example, a reversal of the magnetization of the free layer may cause detection values of the magnetic sensor obtained subsequently to become different from the true values.

On the other hand, when a ferromagnetic layer is disposed around a magnetoresistive element so as to apply a bias magnetic field to the magnetoresistive element, a bias magnetic field of sufficient strength can fail to be applied to the magnetoresistive element due to, for example, restrictions on the location of the ferromagnetic layer.

To cope with this, a magnetoresistive element including a free layer having magnetic shape anisotropy may be employed and the magnetization direction of the free layer may be controlled by providing a ferromagnetic layer to surround the entire perimeter of the magnetoresistive element when viewed from above, as described in, for example, WO2009/090739.

Even in such a case, however, there are problems as described below. In an actually manufactured magnetoresistive element, two side surfaces of the free layer that extend generally in the longitudinal direction of the free layer have minute asperities. The asperities may result in the formation of a nucleus of a magnetization reversal (hereinafter referred to as "reversal nucleus") in the free layer. If a disturbance magnetic field is applied to the free layer with the reversal nucleus formed therein, a magnetization reversal area can expand in the free layer, starting at the reversal nucleus.

This can cause a local or overall magnetization reversal of the free layer.

SUMMARY OF THE INVENTION

It is an object of the present invention to provide a magnetoresistive device that employs a magnetoresistive element including a free layer having magnetic shape anisotropy and that is capable of preventing a reversal of the magnetization of the free layer.

A magnetoresistive device of the present invention includes a magnetoresistive element and a bias magnetic field generation unit. The magnetoresistive element includes a free layer having a magnetization whose direction is variable by a magnetic field applied thereto. The bias magnetic field generation unit includes a ferromagnetic layer for generating a bias magnetic field to be applied to the free layer. The free layer has a first surface and a second surface located at opposite ends in a first direction, and a peripheral surface connecting the first surface and the second surface. The first surface is shaped to be long in a second direction orthogonal to the first direction.

The ferromagnetic layer includes one or two main portions, a first side portion, and a second side portion. In a first cross section passing through the centroid of the first surface and parallel to the first and second directions, the one or two main portions are located on one side or opposite sides of the free layer in the second direction. In a second cross section passing through the centroid of the first surface and perpendicular to the second direction, the first side portion and the second side portion are located on opposite sides of the free layer in a third direction perpendicular to the first and second directions.

In the second cross section, a shortest distance between the peripheral surface of the free layer and the first side portion and a shortest distance between the peripheral surface of the free layer and the second side portion are 35 nm or less.

In the magnetoresistive device of the present invention, in any cross section intersecting the free layer and perpendicular to the second direction, the shortest distance between the peripheral surface of the free layer and the first side portion and the shortest distance between the peripheral surface of the free layer and the second side portion may be 35 nm or less.

In the magnetoresistive device of the present invention, in the second cross section, the shortest distance between the peripheral surface of the free layer and the first side portion and the shortest distance between the peripheral surface of the free layer and the second side portion may be 20 nm or less.

In the magnetoresistive device of the present invention, the magnetoresistive element may further include a magnetization pinned layer having a magnetization in a predetermined direction, and a gap layer disposed between the magnetization pinned layer and the free layer. The magnetization pinned layer, the gap layer and the free layer are stacked in the first direction.

The magnetoresistive device of the present invention may further include a nonmagnetic film separating the free layer from the ferromagnetic layer. In such a case, in the second cross section, the shortest distance between the peripheral surface of the free layer and the first side portion and the shortest distance between the peripheral surface of the free layer and the second side portion may be in the range of 1 to 20 nm.

In the magnetoresistive device of the present invention, the one or two main portions may be two main portions. In such a case, the two main portions, the first side portion and the second side portion may surround the entire perimeter of the free layer as viewed in a direction from the first surface to the second surface of the free layer.

In the magnetoresistive device of the present invention, the bias magnetic field may be in the second direction or in a direction that forms an acute angle with respect to the second direction.

In the magnetoresistive device of the present invention, the bias magnetic field generation unit may further include an antiferromagnetic layer configured to be exchange-coupled with the ferromagnetic layer.

A manufacturing method according to each of first and second aspects of the present invention is a method for manufacturing the magnetoresistive device of the present invention.

The manufacturing method according to the first aspect of the present invention includes the steps of: forming a structure that is to later become the magnetoresistive element; removing a portion of the structure so that the structure becomes the magnetoresistive element and an accommodation portion is formed in the structure; and forming the bias magnetic field generation unit in the accommodation portion.

The manufacturing method according to the second aspect of the present invention includes the steps of: forming a structure that is to later become the bias magnetic field generation unit; removing a portion of the structure so that the structure becomes the bias magnetic field generation unit and an accommodation portion is formed in the structure; and forming the magnetoresistive element in the accommodation portion.

The magnetoresistive device and its manufacturing method of the present invention prevent the formation of a reversal nucleus in the free layer, and as a result, prevent the occurrence of a magnetization reversal of the free layer.

Other and further objects, features and advantages of the present invention will appear more fully from the following description.

DETAILED DESCRIPTION OF THE PREFERRED EMBODIMENTS

First Embodiment

Figure 1:
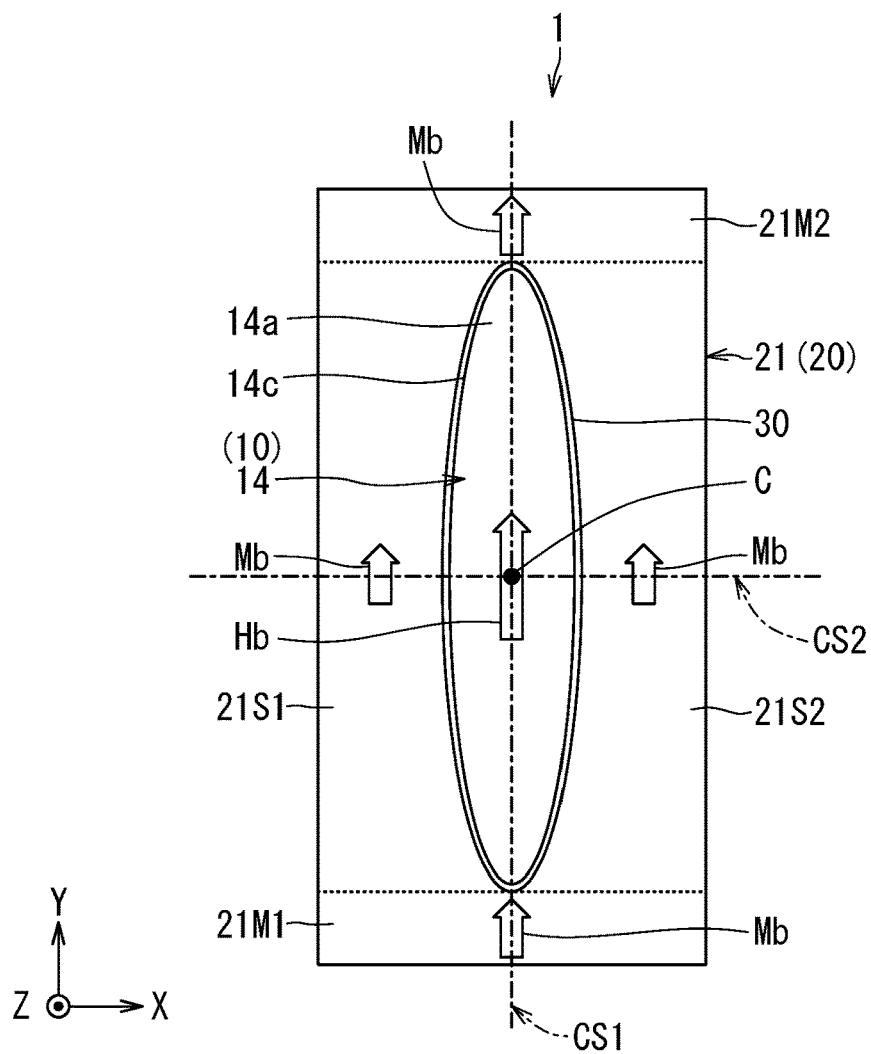
FIG. 1 is a plan view illustrating essential parts of a magnetoresistive device according to a first embodiment of the invention.
Figure 2:
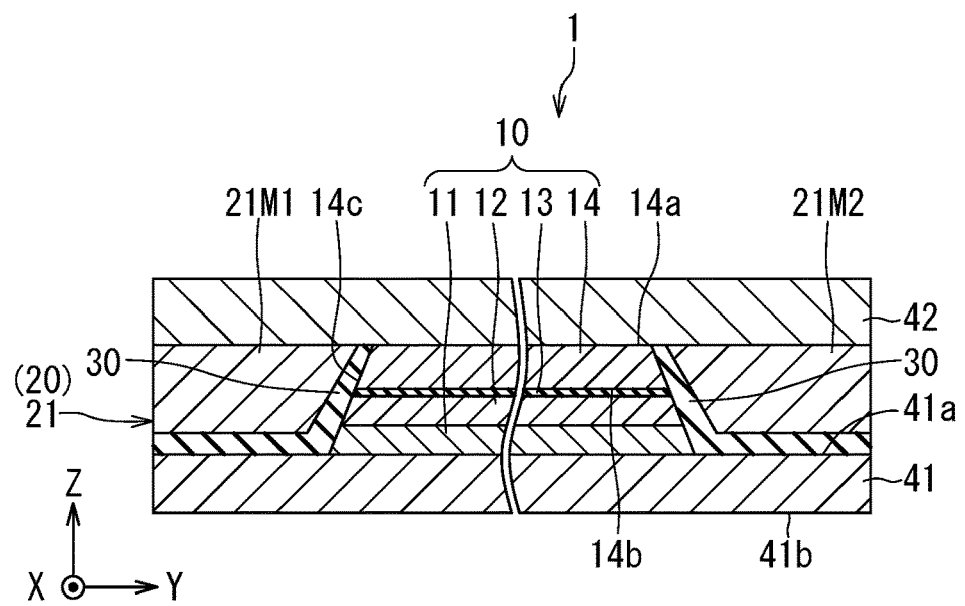
FIG. 2 is a cross-sectional view illustrating a first cross section of the magnetoresistive device according to the first embodiment of the invention.
Figure 3:
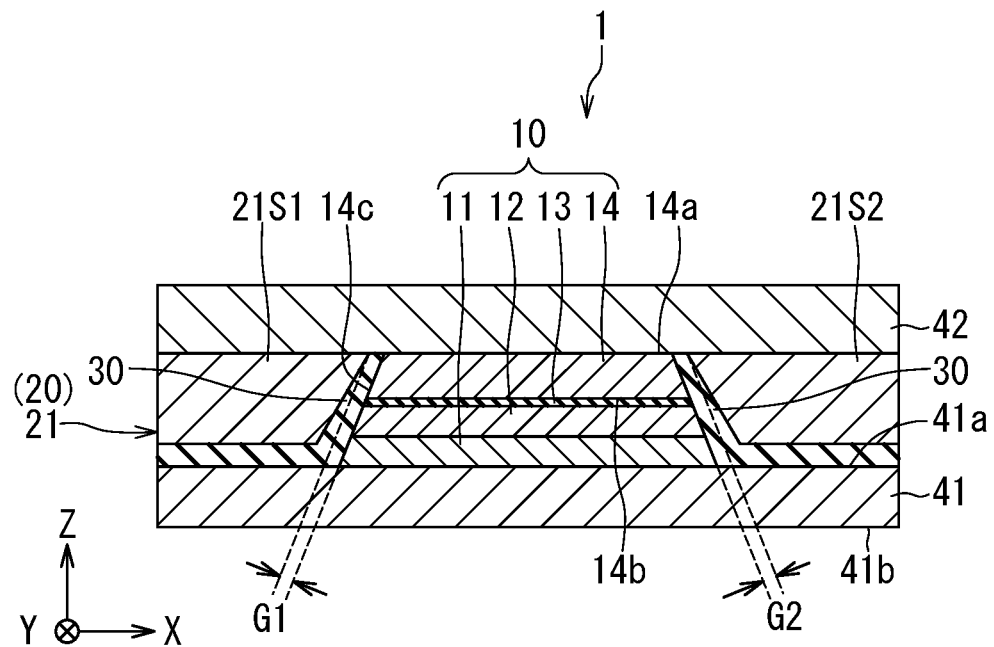
FIG. 3 is a cross-sectional view illustrating a second cross section of the magnetoresistive device according to the first embodiment of the invention.

Preferred embodiments of the present invention will now be described in detail with reference to the drawings. First, a description will be given of the configuration of a magnetoresistive device 1 according to a first embodiment of the invention. FIG. 1 is a plan view illustrating essential parts of the magnetoresistive device 1. FIG. 2 is a cross-sectional view illustrating a first cross section of the magnetoresistive device 1. FIG. 3 is a cross-sectional view illustrating a second cross section of the magnetoresistive device 1. The first cross section and the second cross section will be described later.

As shown in FIGS. 2 and 3, the magnetoresistive device 1 includes a magnetoresistive (MR) element 10, a bias magnetic field generation unit 20, a nonmagnetic film 30, a lower electrode 41, and an upper electrode 42. The lower electrode 41 has a top surface 41a and a bottom surface 41b.

Now, we define X, Y and Z directions as follows. The X, Y and Z directions are orthogonal to each other. In the present embodiment, the Z direction is defined as the direction perpendicular to the top surface 41a of the lower electrode 41 and from the bottom surface 41b to the top surface 41a. The X and Y directions are both parallel to the top surface 41a of the lower electrode 41. The opposite directions to the X, Y, and Z directions will be referred to as −X, −Y, and −Z directions, respectively. The Z direction, the Y direction, and the X direction correspond to a first direction, a second direction, and a third direction in the present invention, respectively. As used herein, the term "above" refers to positions located forward of a reference position in the Z direction, and "below" refers to positions located on a side of the reference position opposite to "above".

The upper electrode 42 is disposed above the lower electrode 41. The MR element 10 is disposed between the lower electrode 41 and the upper electrode 42. The MR element 10 has a bottom surface in contact with the lower electrode 41, a top surface in contact with the upper electrode 42, and a peripheral surface connecting the top and bottom surfaces.

The nonmagnetic film 30 covers a portion of the top surface 41a of the lower electrode 41 around the MR element 10 and the peripheral surface of the MR element 10. The bias magnetic field generation unit 20 is located around the MR element 10 and interposed between the nonmagnetic film 30 and the upper electrode 42. In the present embodiment, the nonmagnetic film 30 is specifically an insulating film.

The MR element 10 includes an antiferromagnetic layer 11, a magnetization pinned layer 12, a gap layer 13, and a free layer 14 stacked in this order, the antiferromagnetic layer 11 being closest to the lower electrode 41. The free layer 14 has a top surface 14a and a bottom surface 14b located at opposite ends in the first direction, i.e., the Z direction, and a peripheral surface 14c connecting the top surface 14a and the bottom surface 14b. The top surface 14a corresponds to the first surface of the free layer in the present invention, and the bottom surface 14b corresponds to the second surface of the free layer in the present invention.

Each of the antiferromagnetic layer 11, the magnetization pinned layer 12 and the gap layer 13 also has a top surface, a bottom surface, and a peripheral surface, like the free layer 14. The peripheral surface of the MR element 10 is constituted of the peripheral surfaces of the antiferromagnetic layer 11, the magnetization pinned layer 12, the gap layer 13, and the free layer 14.

The magnetization pinned layer 12 has a magnetization in a predetermined direction. The antiferromagnetic layer 11 is electrically connected to the lower electrode 41. The antiferromagnetic layer 11 is formed of an antiferromagnetic material and generates an exchange coupling between the magnetization pinned layer 12 and itself, thereby pinning the direction of the magnetization of the magnetization pinned layer 12.

The free layer 14 has a magnetization whose direction is variable by a magnetic field applied thereto. The free layer 14 is electrically connected to the upper electrode 42. The gap layer 13 is disposed between the magnetization pinned layer 12 and the free layer 14.

It should be appreciated that the layers 11 to 14 of the MR element 10 may be stacked in the reverse order to that shown in FIGS. 2 and 3. The MR element 10 may also be configured without the antiferromagnetic layer 11. In such a configuration, for example, a magnetization pinned layer of an artificial antiferromagnetic structure, which includes two ferromagnetic layers and a nonmagnetic metal layer interposed between the two ferromagnetic layers, may be provided in place of the antiferromagnetic layer 11 and the magnetization pinned layer 12.

The upper electrode 42 and the lower electrode 41 are intended to feed a current for magnetic signal detection to the MR element 10.

The MR element 10 is a spin-valve MR element. The MR element 10 is also an MR element of the current-perpendicular-to-plane (CPP) type in which the current for magnetic signal detection is fed in a direction generally perpendicular to the plane of the layers constituting the MR element 10.

The MR element 10 may be either a tunneling magnetoresistive (TMR) element or a giant magnetoresistive (GMR) element. In the TMR element, the gap layer 13 is a tunnel barrier layer. In the GMR element, the gap layer 13 is a nonmagnetic conductive layer. The MR element 10 varies in resistance value according to the angle that the magnetization direction of the free layer 14 forms with respect to the magnetization direction of the magnetization pinned layer 12, and has a lowest resistance when the foregoing angle is 0° and a highest resistance when the foregoing angle is 180°.

FIG. 1 shows the MR element 10 and the bias magnetic field generation unit 20, omitting the upper electrode 42. FIG. 1 illustrates the shapes and locations of the MR element 10 and the bias magnetic field generation unit 20 as viewed in the direction from the top surface 14a to the bottom surface 14b of the free layer 14, that is, as viewed from above. As viewed from above, the MR element 10 is shaped to be long in the second direction, i.e., the Y direction. Thus, as shown in FIG. 1, the top surface 14a and the whole of the free layer 14 are also shaped to be long in the Y direction. The free layer 14 thus has magnetic shape anisotropy. The free layer 14 has an easy axis of magnetization oriented in the longitudinal direction of the free layer 14, that is, in a direction parallel to the Y direction. The magnetization of the magnetization pinned layer 12 is oriented in the X or −X direction, for example.

FIG. 1 shows an example in which the MR element 10 and the free layer 14 are elliptical in shape as viewed from above. However, the MR element 10 and the free layer 14 need not necessarily be elliptical but can be rectangular, for example.

The bias magnetic field generation unit 20 is intended to apply a bias magnetic field to the free layer 14. The bias magnetic field generation unit 20 includes a ferromagnetic layer 21 for generating the bias magnetic field to be applied to the free layer 14. In the present embodiment, the ferromagnetic layer 21 is specifically a hard magnetic layer formed of a hard magnetic material. The ferromagnetic layer 21 of the present embodiment preferably has a coercivity of 250 Oe (1 Oe=79.6 A/m) or higher. The nonmagnetic film 30 separates the free layer 14 from the ferromagnetic layer 21.

As shown in FIG. 1, a cross section that passes through the centroid C of the top surface 14a of the free layer 14 and is parallel to the Z and Y directions will be referred to as a first cross section CS1. A cross section that passes through the centroid C and is perpendicular to the Y direction will be referred to as a second cross section CS2. FIG. 2 shows the first cross section CS1 as viewed from the right in FIG. 1. FIG. 3 shows the the second cross section CS2 as viewed from the bottom in FIG. 1.

The ferromagnetic layer 21 includes one or two main portions, a first side portion 21S1, and a second side portion 21S2. The one or two main portions are portions that are necessary for applying a bias magnetic field to the free layer 14. FIG. 1 illustrates an example in which the one or two main portions are two main portions 21M1 and 21M2. As will be described in detail later, the first and second side portions 21S1 and 21S2 are portions that are necessary for preventing the formation of a reversal nucleus in the free layer 14.

As shown in FIGS. 1 and 2, in the first cross section CS1 the two main portions 21M1 and 21M2 are located on opposite sides of the free layer 14 in the Y direction. The main portion 21M1 is located forward of the free layer 14 in the −Y direction. The main portion 21M2 is located forward of the free layer 14 in the Y direction.

The one or two main portions may be one of the main portions 21M1 and 21M2. In such a case, in the first cross section CS1 the one main portion is located on one side of the free layer 14 in the Y direction.

As shown in FIGS. 1 and 3, in the second cross section CS2 the first and second side portions 21S1 and 21S2 are located on opposite sides of the free layer 14 in the X direction. The first side portion 21S1 is located forward of the free layer 14 in the −X direction. The second side portion 21S2 is located forward of the free layer 14 in the X direction.

Each of the first and second side portions 21S1 and 21S2 has an end face that is opposed to the peripheral surface of the MR element 10 with the nonmagnetic film 30 interposed therebetween. The end face of each of the first and second side portions 21S1 and 21S2 includes a portion opposed to the peripheral surface 14c of the free layer 14.

In the present embodiment, as shown in FIG. 1, the two main portions 21M1 and 21M2, the first side portion 21S1 and the second side portion 21S2 are contiguous and surround the entire perimeter of the free layer 14 as viewed in the direction from the top surface 14a to the bottom surface 14b of the free layer 14, that is, as viewed from above. In FIG. 1, the boundary between the main portion 21M1 and the first side portion 21S1, the boundary between the main portion 21M1 and the second side portion 21S2, the boundary between the main portion 21M2 and the first side portion 21S1, and the boundary between the main portion 21M2 and the second side portion 21S2 are indicated by dotted lines.

As shown in FIG. 3, a shortest distance between the peripheral surface 14c of the free layer 14 and the first side portion 21S1 in the second cross section CS2 will be referred to as the first distance G1, and a shortest distance between the peripheral surface 14c of the free layer 14 and the second side portion 21S2 in the second cross section CS2 will be referred to as the second distance G2. In the present embodiment, the first and second distances G1 and G2 are 35 nm or less.

In the present embodiment, specifically, the shortest distance between the peripheral surface 14c of the free layer 14 and the first side portion 21S1 and the shortest distance between the peripheral surface 14c of the free layer 14 and the second side portion 21S2 are 35 nm or less in not only the second cross section CS1 but also in any cross section intersecting the free layer 14 and perpendicular to the Y direction.

Further, in the entire region where the peripheral surface 14c of the free layer 14 and the end face of the first side portion 21S1 are opposed to each other, the distance between the peripheral surface 14c of the free layer 14 and the first side portion 21S1 is preferably 35 nm or less. Likewise, in the entire region where the peripheral surface 14c of the free layer 14 and the end face of the second side portion 21S2 are opposed to each other, the distance between the peripheral surface 14c of the free layer 14 and the second side portion 21S2 is preferably 35 nm or less.

In FIG. 1, the four arrows Mb indicate an example of the respective magnetization directions of the two main portions 21M1 and 21M2 and the first and second side portions 21S1 and 21S2. In this example, all the magnetization directions Mb of the four portions 21M1, 21M2, 21S1 and 21S2 are the Y direction. In FIG. 1, the arrow Hb indicates the direction of the bias magnetic field to be applied to the free layer 14. In this example, the direction Hb of the bias magnetic field is also the Y direction. In such a case, the magnetization direction of the free layer 14 in a state where no magnetic field other than the bias magnetic field is applied thereto is also the Y direction.

Figure 4:
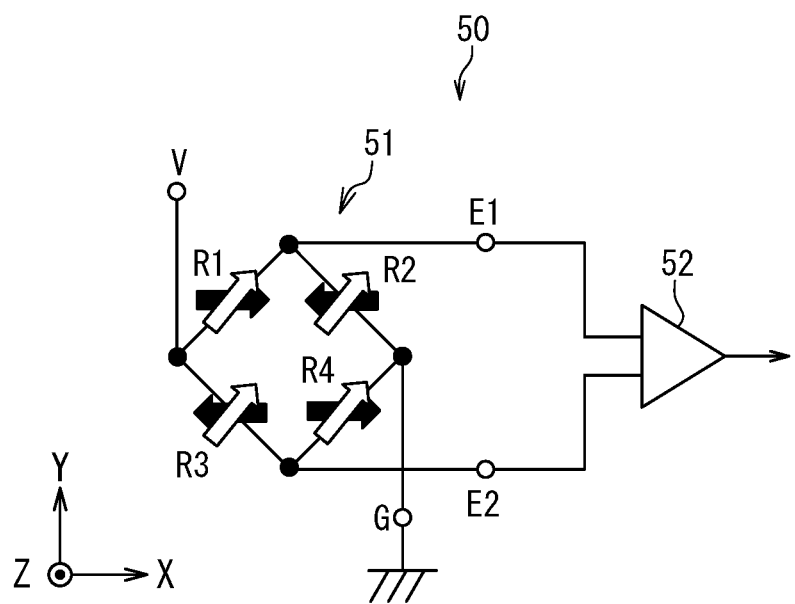
FIG. 4 is a circuit diagram illustrating the configuration of an example magnetic sensor including the magnetoresistive device according to the first embodiment of the invention.

The magnetoresistive device 1 according to the present embodiment is employed in a magnetic sensor, for example. Reference is now made to FIG. 4 to describe an example magnetic sensor that employs the magnetoresistive device 1 according to the present embodiment. FIG. 4 is a circuit diagram illustrating the configuration of the example magnetic sensor.

The magnetic sensor 50 shown in FIG. 4 is configured to generate a detection signal that varies according to the strength in the X or −X direction of a magnetic field targeted for detection. The magnetic sensor 50 includes a Wheatstone bridge circuit 51 and a difference detector 52. The Wheatstone bridge circuit 51 includes a power supply port V configured to receive a predetermined voltage, a ground port G connected to the ground, a first output port E1, and a second output port E2.

The Wheatstone bridge circuit 51 further includes a first resistor section R1, a second resistor section R2, a third resistor section R3, and a fourth resistor section R4. The first resistor section R1 is provided between the power supply port V and the first output port E1. The second resistor section R2 is provided between the first output port E1 and the ground port G. The third resistor section R3 is provided between the power supply port V and the second output port E2. The fourth resistor section R4 is provided between the second output port E2 and the ground port G.

Each of the resistor sections R1, R2, R3, and R4 includes the magnetoresistive device 1 according to the present embodiment. In FIG. 4, the filled arrows indicate the magnetization directions of the magnetization pinned layers 12, and the hollow arrows indicate the magnetization directions of the free layers 14. The magnetization pinned layers 12 in the resistor sections R1 and R4 have magnetizations in the X direction. The magnetization pinned layers 12 in the resistor sections R2 and R3 have magnetizations in the −X direction.

The magnetization direction of the free layer 14 in each of the resistor sections R1, R2, R3, and R4 varies according to the strength of the magnetic field targeted for detection. In FIG. 4, the angle that the magnetization direction of the free layer 14 forms with respect to the X direction as viewed in a counterclockwise direction from the X direction varies over a range greater than 0° and smaller than 180°. The potential at each of the output ports E1 and E2 and the potential difference between the output ports E1 and E2 vary according to the magnetization direction of the free layer 14. The difference detector 52 outputs a signal corresponding to the potential difference between the output ports E1 and E2 as a detection signal of the magnetic sensor 50. The detection signal varies according to the strength of the magnetic field targeted for detection.

Figure 5:
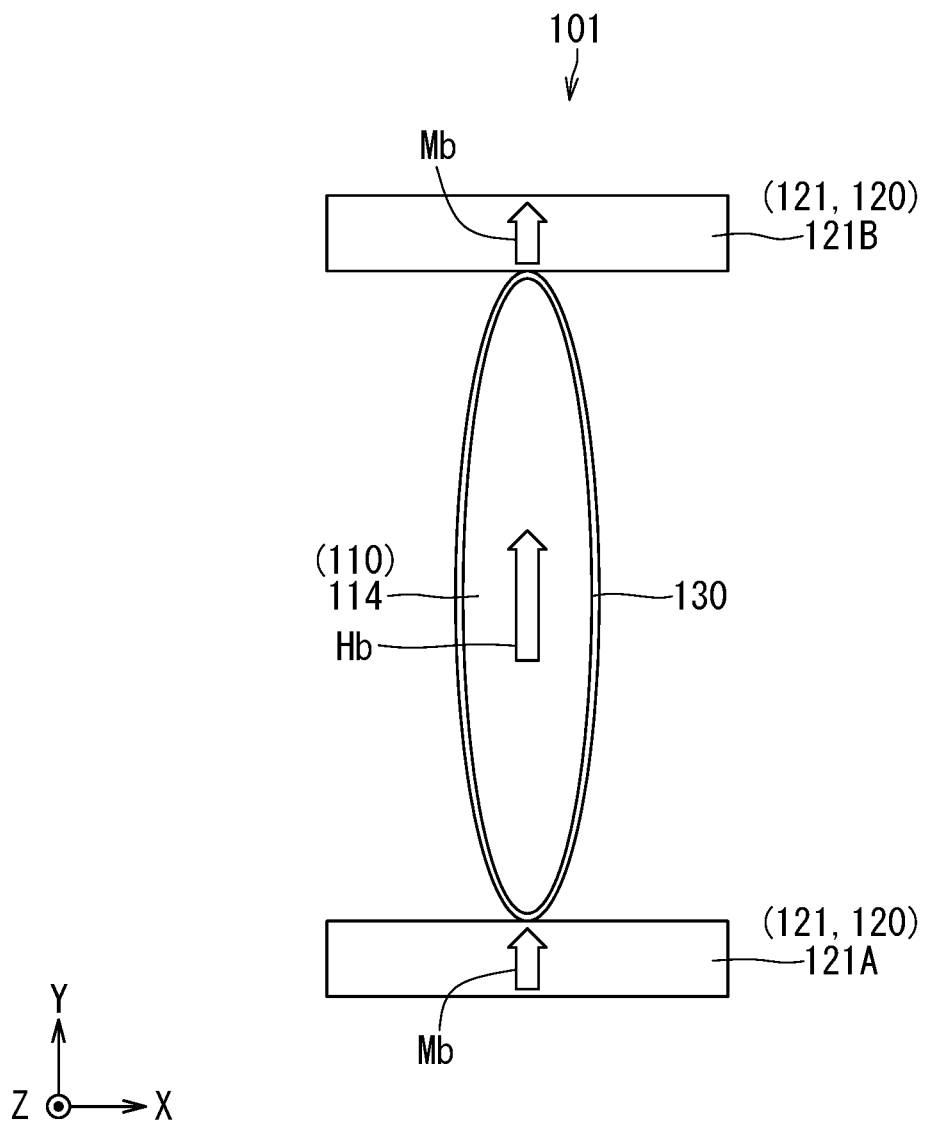
FIG. 5 is a plan view illustrating essential parts of a magnetoresistive device of a comparative example.

The function and effect of the magnetoresistive device 1 according to the present embodiment will now be described. First, a description will be given of a problem of a magnetoresistive device of a comparative example. FIG. 5 is a plan view illustrating essential parts of the magnetoresistive device 101 of the comparative example. The magnetoresistive device 101 of the comparative example has an MR element 110, a bias magnetic field generation unit 120, a nonmagnetic film 130, and upper and lower electrodes (not illustrated).

Like the MR element 10 of the present embodiment, the MR element 110 includes an antiferromagnetic layer, a magnetization pinned layer, a gap layer, and a free layer 114 stacked in this order, the antiferromagnetic layer being closest to the lower electrode. The MR element 110 has the same shape as the MR element 10 of the present embodiment.

The bias magnetic field generation unit 120 is intended to apply a bias magnetic field to the free layer 114. The bias magnetic field generation unit 120 includes a ferromagnetic layer 121 for generating the bias magnetic field to be applied to the free layer 114. The ferromagnetic layer 121 includes a first portion 121A and a second portion 121B. The first portion 121A is located forward of the free layer 114 in the −Y direction. The second portion 121B is located forward of the free layer 114 in the Y direction. The ferromagnetic layer 121 includes no portions corresponding to the first and second side portions 21S1 and 21S2 of the ferromagnetic layer 21 of the present embodiment.

The nonmagnetic film 130 covers the peripheral surface of the MR element 110 and separates the free layer 114 from the ferromagnetic layer 121.

In FIG. 5, the two arrows Mb indicate the magnetization direction of the first and second portions 121A and 121B. The first and second portions 121A and 121B are magnetized in the Y direction. The bias magnetic field to be applied to the free layer 114 is also in the Y direction.

Figure 6:
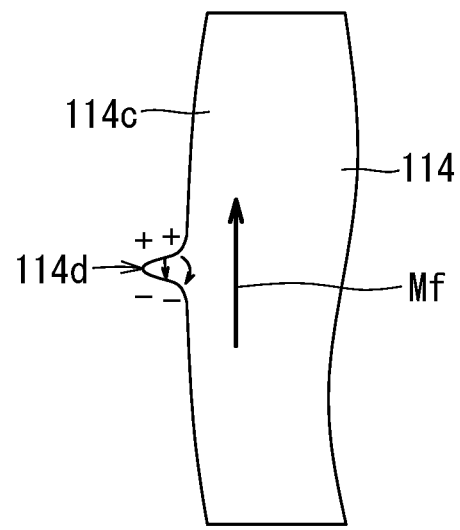
FIG. 6 is an explanatory diagram for explaining a problem of the magnetoresistive device of the comparative example.

Next, the problem of the magnetoresistive device 101 of the comparative example will be described with reference to FIG. 6. In an actually manufactured MR element, the peripheral surface of its free layer typically has minute asperities. The asperities may result in the formation of a reversal nucleus in the free layer. FIG. 6 illustrates a state where the reversal nucleus is formed in the free layer 114 in the comparative example. FIG. 6 shows a protrusion 114d of a peripheral surface 114c of the free layer 114. In FIG. 6, the arrow Mf indicates the magnetization direction of the free layer 114. As shown in FIG. 6, in the vicinity of the protrusion 114d of the free layer 114, a demagnetizing field occurs due to the protrusion 114d to produce a small area magnetized in a direction different from, such as opposite to, the magnetization direction Mf of the free layer 114. The small area becomes a reversal nucleus. In FIG. 6, the signs "+" and "−" represent an N pole and an S pole occurring near the protrusion 114d, respectively. The two arrows drawn near the protrusion 114d represent the demagnetizing field.

In the magnetoresistive device 101 of the comparative example, if a disturbance magnetic field is applied to the free layer 114 with the reversal nucleus formed therein, the magnetization reversal area can expand in the free layer 114, starting at the reversal nucleus. This can cause a local or overall magnetization reversal of the free layer 114. If the magnetization reversal of the free layer 114 occurs thus, the magnetoresistive device 101 changes in characteristic compared to before the occurrence of the magnetization reversal of the free layer 114. This causes variations in the characteristics of, for example, a magnetic sensor that employs the magnetoresistive device 101. Examples of variations in the characteristics of the magnetic sensor include degradation in sensitivity, linearity, and hysteresis characteristics.

Figure 7:
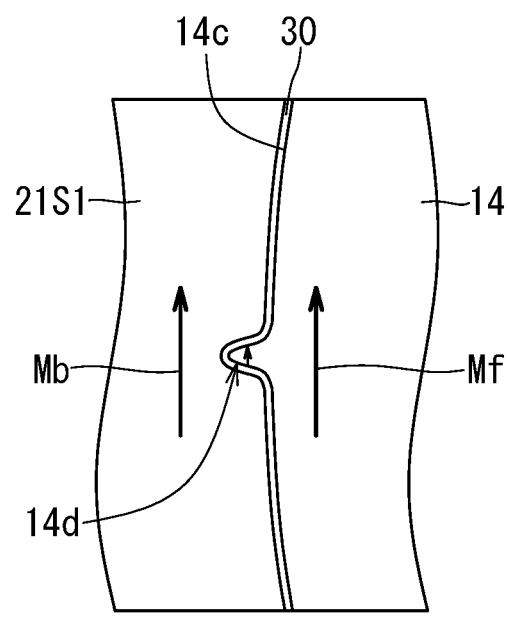
FIG. 7 is an explanatory diagram for explaining the effect of the magnetoresistive device according to the first embodiment of the invention.

Next, the effect of the magnetoresistive device 1 according to the present embodiment will be described with reference to FIG. 7. FIG. 7 shows part of each of the free layer 14, the first side portion 21S1, and the nonmagnetic film 30 as viewed from above. FIG. 7 shows a protrusion 14d of the peripheral surface 14c of the free layer 14. In FIG. 7, the arrow Mf indicates the magnetization direction of the free layer 14, and the arrow Mb indicates the magnetization direction of the first side portion 21S1.

In the present embodiment, the free layer 14 is magnetostatically coupled with the first and second side portions 21S1 and 21S2. In FIG. 7, the arrow drawn inside the protrusion 14d represents a magnetic field generated inside the protrusion 14d by the first side portion 21S1. As shown in FIG. 7, the present embodiment prevents the occurrence of a demagnetizing field due to the protrusion 14d in the vicinity of the protrusion 14d.

In the present embodiment, the magnetostatic coupling of the free layer 14 with the first side portion 21S1 prevents a reversal nucleus from occurring in the free layer 14 due to minute asperities present on part of the peripheral surface 14c of the free layer 14 facing the first side portion 21S1. Similarly, in the present embodiment, the magnetostatic coupling of the free layer 14 with the second side portion 21S2 prevents a reversal nucleus from occurring in the free layer 14 due to minute asperities present on part of the peripheral surface 14c of the free layer 14 facing the second side portion 21S2. The present embodiment thus prevents a magnetization reversal of the free layer 14.

To magnetostatically couple the free layer 14 with the first and second side portions 21S1 and 21S2, the distance between the peripheral surface 14c of the free layer 14 and the first side portion 21S1 and the distance between the peripheral surface 14c of the free layer 14 and the second side portion 21S2 need to be somewhat small. In the present embodiment, the requirement that the first and second distances G1 and G2 be 35 nm or less is needed to magnetostatically couple the free layer 14 with the first and second side portions 21S1 and 21S2.

Figure 8:
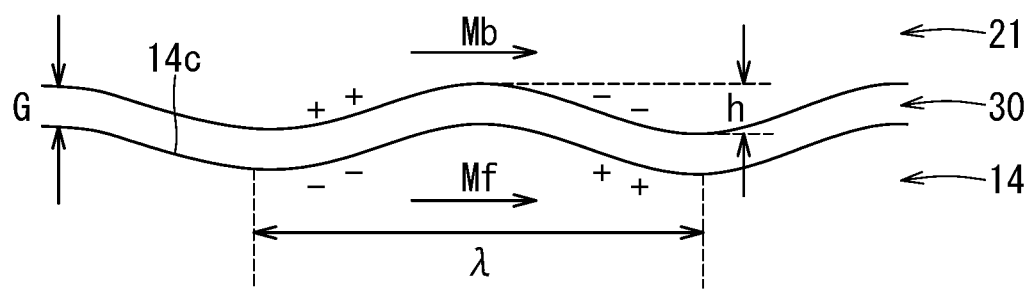
FIG. 8 is an explanatory diagram illustrating a simulation model.

Next, the definitions of the first and second distances G1 and G2 in the present embodiment will be described with reference to simulation results. FIG. 8 is an explanatory diagram illustrating a simulation model. The model includes a free layer 14, a ferromagnetic layer 21, and a nonmagnetic film 30 therebetween. Mutually opposed parts of a peripheral surface 14c of the free layer 14 and an end face of the ferromagnetic layer 21 each have asperities of a constant period $\lambda$ and a constant amplitude h. The mutually opposed parts of the peripheral surface 14c of the free layer 14 and the end face of the ferromagnetic layer 21 are at a constant distance G from each other. In FIG. 8, the signs "+" and "−" represent an N pole and an S pole, respectively.

In the model shown in FIG. 8, the asperities produce Neel coupling between the free layer 14 and the ferromagnetic layer 21. The interlayer coupling energy from the Neel coupling between the free layer 14 and the ferromagnetic layer 21 depends on the foregoing period λ, amplitude h, and distance G.

Figure 9:
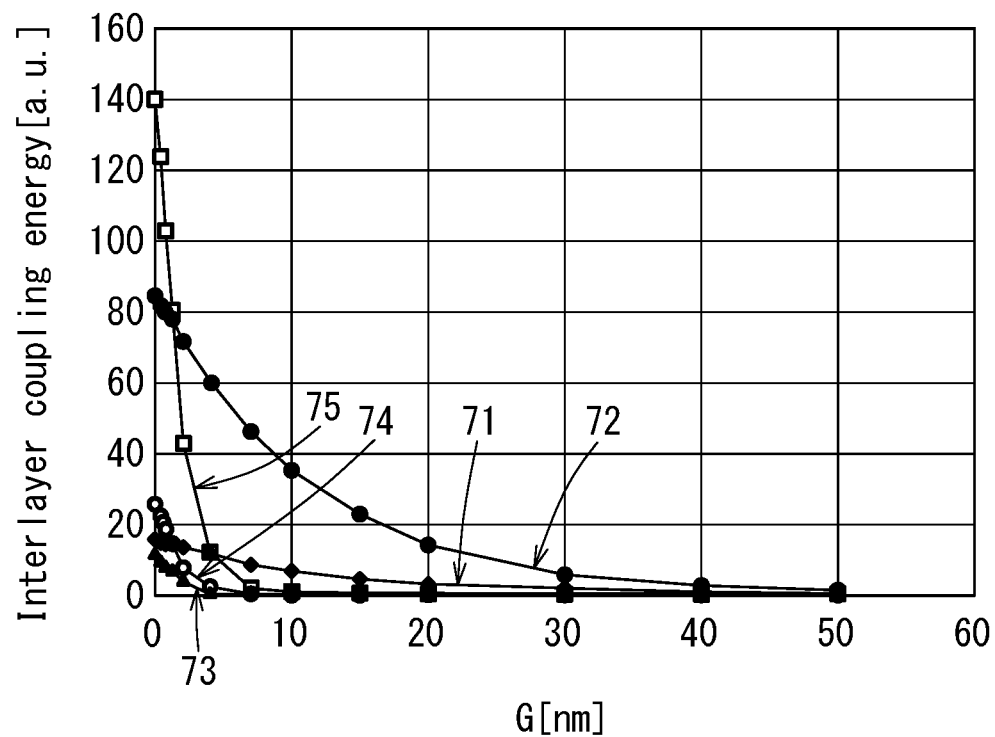
FIG. 9 is a characteristic diagram illustrating simulation results.

Relationships of the period λ, amplitude h, and distance G with the interlayer coupling energy were examined by simulation. FIG. 9 shows the simulation results. In FIG. 9, the horizontal axis represents the distance G, and the vertical axis represents the interlayer coupling energy expressed in an arbitrary unit (a.u.). In FIG. 9, the line designated by the reference numeral 71 represents the relationship between the distance G and the interlayer coupling energy at a period λ of 100 nm and an amplitude h of 15 nm. The line designated by the reference numeral 72 represents the relationship between the distance G and the interlayer coupling energy at a period λ of 100 nm and an amplitude h of 35 nm. The line designated by the reference numeral 73 represents the relationship between the distance G and the interlayer coupling energy at a period λ of 14 nm and an amplitude h of 5 nm. The line designated by the reference numeral 74 represents the relationship between the distance G and the interlayer coupling energy at a period λ of 14 nm and an amplitude h of 8 nm. The line designated by the reference numeral 75 represents the relationship between the distance G and the interlayer coupling energy at a period λ of 14 nm and an amplitude h of 18 nm.

As shown in FIG. 9, the greater the distance G, the lower the interlayer coupling energy. If the distance G exceeds 35 nm, the interlayer coupling energy becomes extremely small, even in the case corresponding to the reference numeral 72 where the interlayer coupling energy is the highest among the five cases corresponding to the reference numerals 71 to 75. In the present embodiment, the first and second distances G1 and G2 are thus set to 35 nm or less. The first and second distances G1 and G2 are desirably 20 nm or less.

The first and second distances G1 and G2 are almost equal to the thickness of the nonmagnetic film 30. To form a defectless nonmagnetic film 30, the first and second distances G1 and G2 are desirably 1 nm or more. It is thus preferred that the first and second distances G1 and G2 fall within the range of 1 to 20 nm if the magnetoresistive device 1 includes the nonmagnetic film 30.

Figure 10:
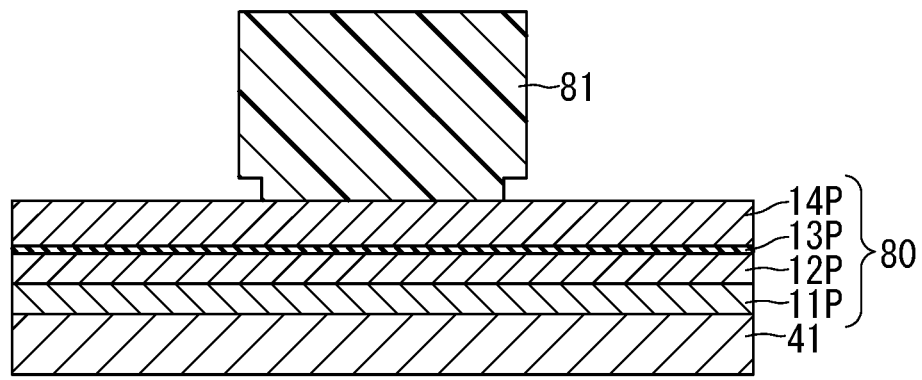
FIG. 10 is a cross-sectional view illustrating a step of a manufacturing method for the magnetoresistive device according to the first embodiment of the invention.
Figure 11:
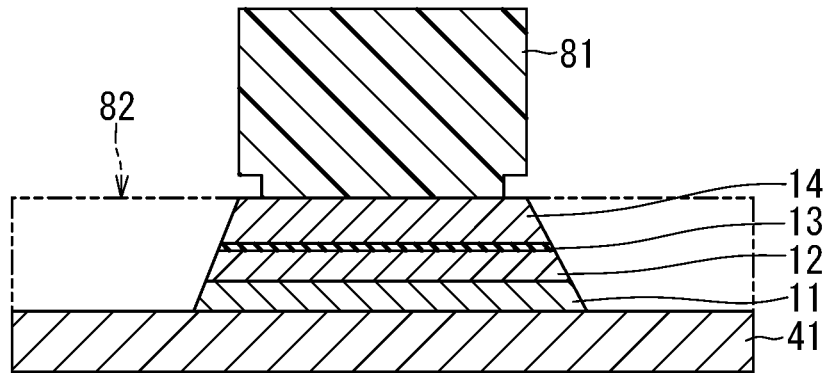
FIG. 11 is a cross-sectional view illustrating a step that follows the step of FIG. 10.
Figure 12:
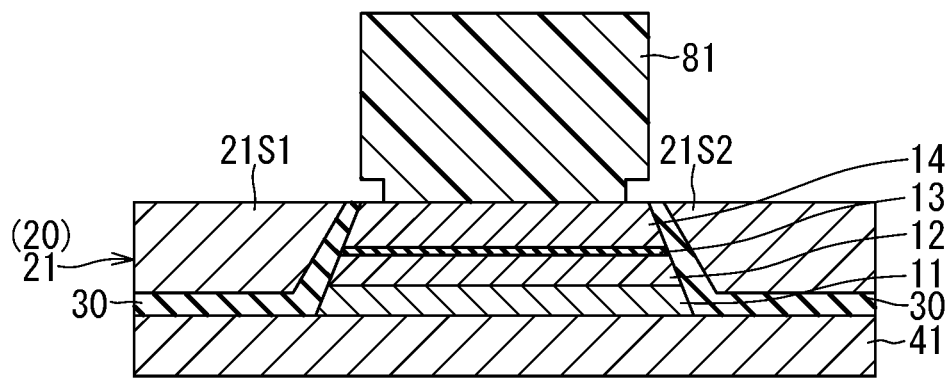
FIG. 12 is a cross-sectional view illustrating a step that follows the step of FIG. 11.

Reference is now made to FIGS. 10 to 12 to describe a manufacturing method for the magnetoresistive device 1 according to the present embodiment. FIGS. 10 to 12 each illustrate a cross section of a layered structure formed in the process of manufacturing the magnetoresistive device 1, the cross section corresponding to the second cross section mentioned previously.

As shown in FIG. 10, the manufacturing method for the magnetoresistive device 1 according to the present embodiment starts with forming the lower electrode 41 on a substrate (not illustrated). Then, formed on the lower electrode 41 is a structure 80 which is to become the MR element 10 later. More specifically, an antiferromagnetic film 11P to become the antiferromagnetic layer 11, a magnetic film 12P to become the magnetization pinned layer 12, a nonmagnetic film 13P to become the gap layer 13, and a magnetic film 14P to become the free layer 14 are formed in this order on the lower electrode 41 by sputtering, for example. Then, a mask 81 to be used for patterning the structure 80 is formed on the structure 80. The mask 81 is preferably shaped to have an undercut as shown in FIG. 10 for the sake of easy removal in a later step.

FIG. 11 shows the next step. In this step, using the mask 81 as an etching mask, a portion of the structure 80 is removed by, for example, ion milling, so that the structure 80 becomes the MR element 10 and an accommodation portion 82 is formed in the structure 80.

FIG. 12 shows the next step. In this step, first, the nonmagnetic film 30, and the ferromagnetic layer 21 constituting the bias magnetic field generation unit 20 are formed in this order by, for example, sputtering over the entire top surface of the layered structure shown in FIG. 11 with the mask 81 left unremoved. The bias magnetic field generation unit 20 (the ferromagnetic layer 21) is formed in the accommodation portion 82 shown in FIG. 11. The mask 81 is then removed. Next, the upper electrode 42 is formed on the MR element 10, the bias magnetic field generation unit 20 (the ferromagnetic layer 21) and the nonmagnetic film 30. The magnetoresistive device 1 is thereby completed.

The manufacturing method for the magnetoresistive device 1 according to the present embodiment enables the formation of the MR element 10 and the bias magnetic field generation unit 20 in a self-aligned manner. The present embodiment thus enables precise alignment of the MR element 10 and the bias magnetic field generation unit 20 with respect to each other. Further, according to the present embodiment, the distance between the peripheral surface 14c of the free layer 14 and the first side portion 21S1, and the distance between the peripheral surface 14c of the free layer 14 and the second side portion 21S2 can be precisely controlled to be of desired small values.

Now, a description will be given of first and second modification examples of the magnetoresistive device 1 according to the present embodiment.

Figure 13:
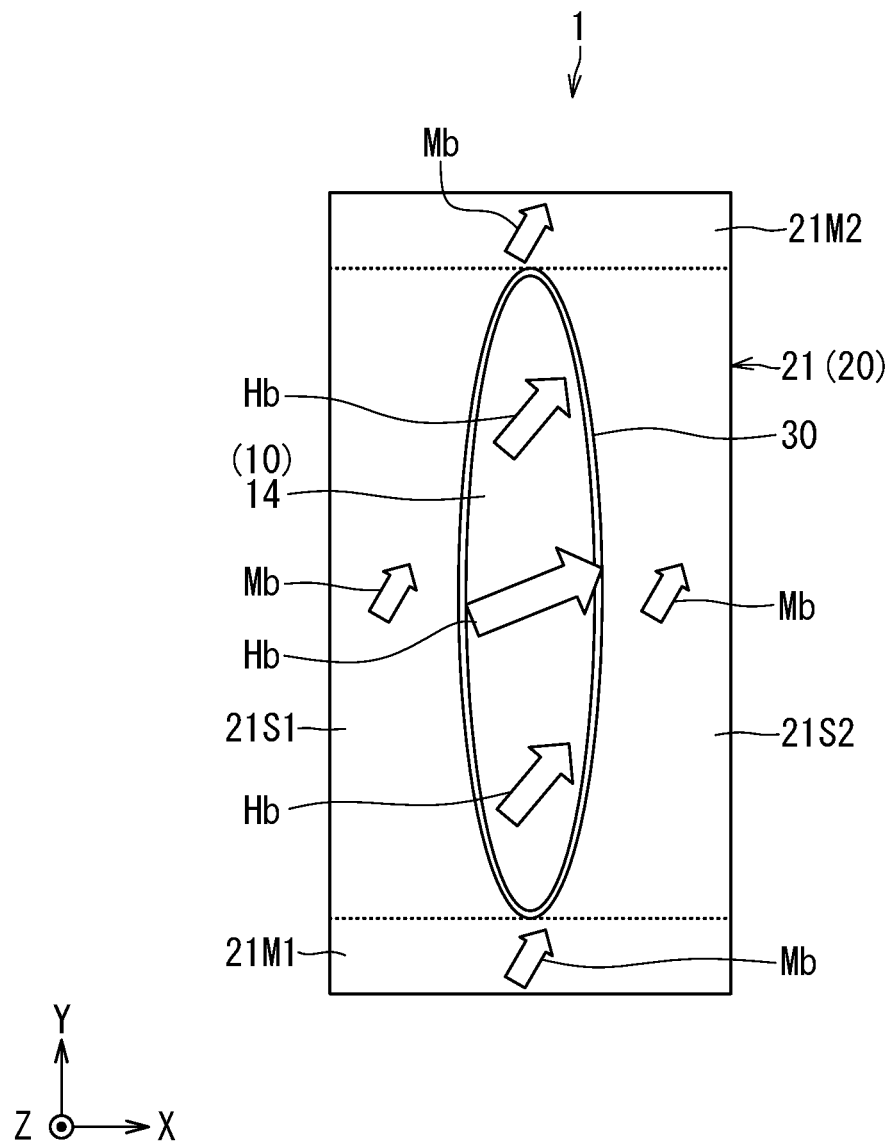
FIG. 13 is a plan view illustrating essential parts of a magnetoresistive device of a first modification example of the first embodiment of the invention.

FIG. 13 is a plan view illustrating essential parts of a magnetoresistive device 1 of the first modification example. In the first modification example, the two main portions 21M1 and 21M2, the first side portion 21S1, and the second side portion 21S2 have the same magnetization direction Mb that forms an acute angle with respect to the second direction, i.e., Y direction. In the first modification example, the direction of the bias magnetic field forms an acute angle with respect to the second direction, i.e., Y direction. In FIG. 13, the three arrows Hb represent the directions of the bias magnetic field at three positions in the free layer 14 where the three arrows are drawn. In the example shown in FIG. 13, all the directions of the bias magnetic field at the three positions are somewhat more inclined toward the X direction than is the magnetization direction Mb of the main portions 21M1 and 21M2 and the side portions 21S1 and 21S2. As shown in FIG. 13, the direction of the bias magnetic field may vary to some extent, depending on the position in the free layer 14. In the first modification example, the magnetization direction of the free layer 14 in the state where no magnetic field other than the bias magnetic field is applied to the free layer 14 is determined by the anisotropic magnetic field resulting from the magnetic shape anisotropy of the free layer 14 and the bias magnetic field. The magnetization direction of the free layer 14 forms an acute angle with respect to the Y direction.

According to the first modification example, the magnetization direction of the free layer 14 in the state where no magnetic field other than the bias magnetic field is applied thereto is controllable by the direction Hb of the bias magnetic field. This makes it possible to adjust the operation region of the MR element 10.

Figure 14:
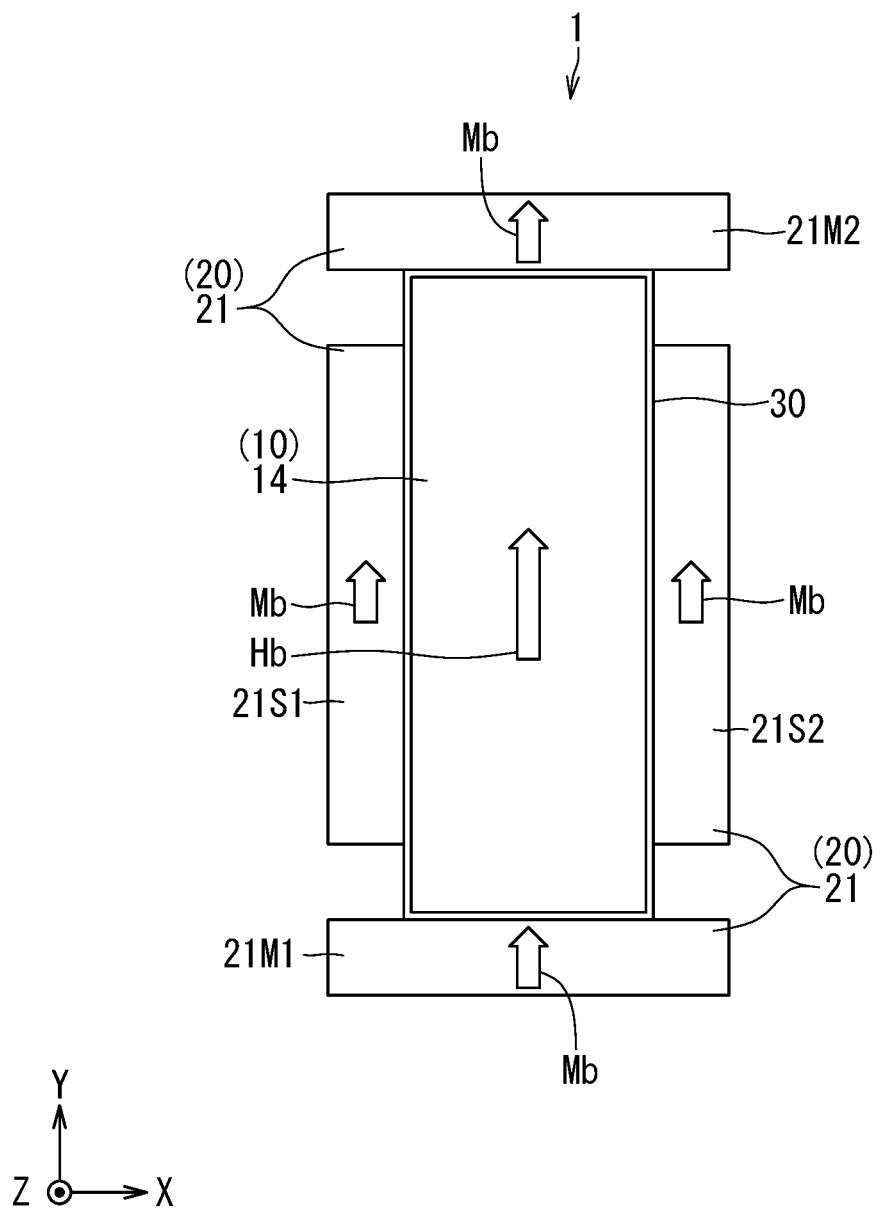
FIG. 14 is a plan view illustrating essential parts of a magnetoresistive device of a second modification example of the first embodiment of the invention.

FIG. 14 is a plan view illustrating essential parts of a magnetoresistive device 1 of the second modification example. In the second modification example, the MR element 10 and the free layer 14 as viewed from above are in the shape of a rectangle that is long in the Y direction. Further, in the second modification example, the ferromagnetic layer 21 of the bias magnetic field generation unit 20 includes two main portions 21M1 and 21M2, a first side portion 21S1, and a second side portion 21S2 separated from each other.

In the first cross section CS1, the two main portions 21M1 and 21M2 are located on opposite sides of the free layer 14 in the Y direction. The main portion 21M1 is located forward of the free layer 14 in the −Y direction. The main portion 21M2 is located forward of the free layer 14 in the Y direction.

In the second cross section CS2, the first and second side portions 21S1 and 21S2 are located on opposite sides of the free layer 14 in the X direction. The first side portion 21S1 is located forward of the free layer 14 in the −X direction. The second side portion 21S2 is located forward of the free layer 14 in the X direction. The nonmagnetic film 30 separates the free layer 14 from the ferromagnetic layer 21.

FIG. 14 illustrates an example in which the one or two main portions are two main portions 21M1 and 21M2. Alternatively, the one or two main portions may be one of the main portions 21M1 and 21M2.

In the second modification example, the magnetization direction Mb of the two main portions 21M1 and 21M2 and the first and second side portions 21S1 and 21S2 and the direction Hb of the bias magnetic field may be the Y direction, or may be the same direction forming an acute angle with respect to the Y direction like the first modification example.

The second modification example in which the one or two main portions, the first side portion 21S1, and the second side portion 21S2 are separated from each other provides the same effects as those obtained when those portions are contiguous.

Second Embodiment

Figure 15:
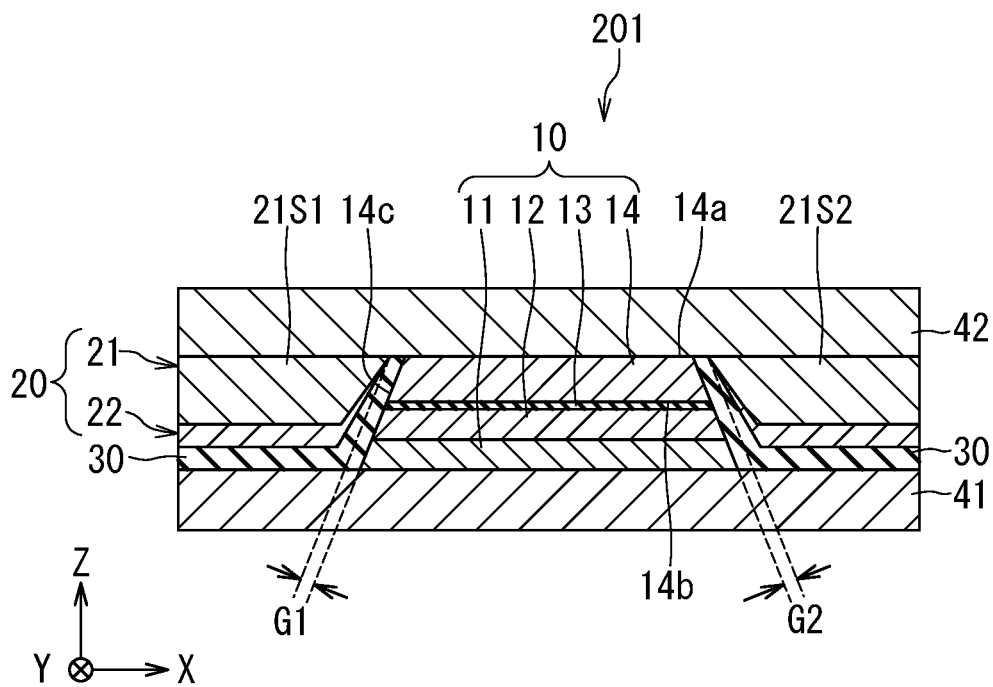
FIG. 15 is a cross-sectional view of a magnetoresistive device according to a second embodiment of the invention.

A second embodiment of the invention will now be described with reference to FIG. 15. FIG. 15 is a cross-sectional view of a magnetoresistive device 201 according to the second embodiment. Note that FIG. 15 shows a cross section corresponding to the second cross section of the magnetoresistive device 1 according to the first embodiment (see FIG. 3).

The configuration of the magnetoresistive device 201 according to the present embodiment differs from that of the magnetoresistive device 1 according to the first embodiment in the following ways. In the magnetoresistive device 201 according to the present embodiment, the ferromagnetic layer 21 of the bias magnetic field generation unit 20 is a soft magnetic layer formed of a soft magnetic material. The ferromagnetic layer 21 of the present embodiment preferably has a coercivity of 20 Oe or lower.

In the present embodiment, the bias magnetic field generation unit 20 further includes an antiferromagnetic layer 22 configured to be exchange-coupled with the ferromagnetic layer 21. The antiferromagnetic layer 22 is located between the ferromagnetic layer 21 and the nonmagnetic film 30.

As has been described in relation to the first embodiment, the ferromagnetic layer 21 includes one or two main portions, a first side portion 21S1, and a second side portion 21S2. The antiferromagnetic layer 22 is formed of an antiferromagnetic material and generates an exchange coupling between the ferromagnetic layer 21 and itself, thereby pinning the magnetization directions of the one or two main portions and the first and second side portions 21S1 and 21S2.

The configuration, operation and effects of the present embodiment are otherwise the same as those of the first embodiment.

Third Embodiment

Figure 16:
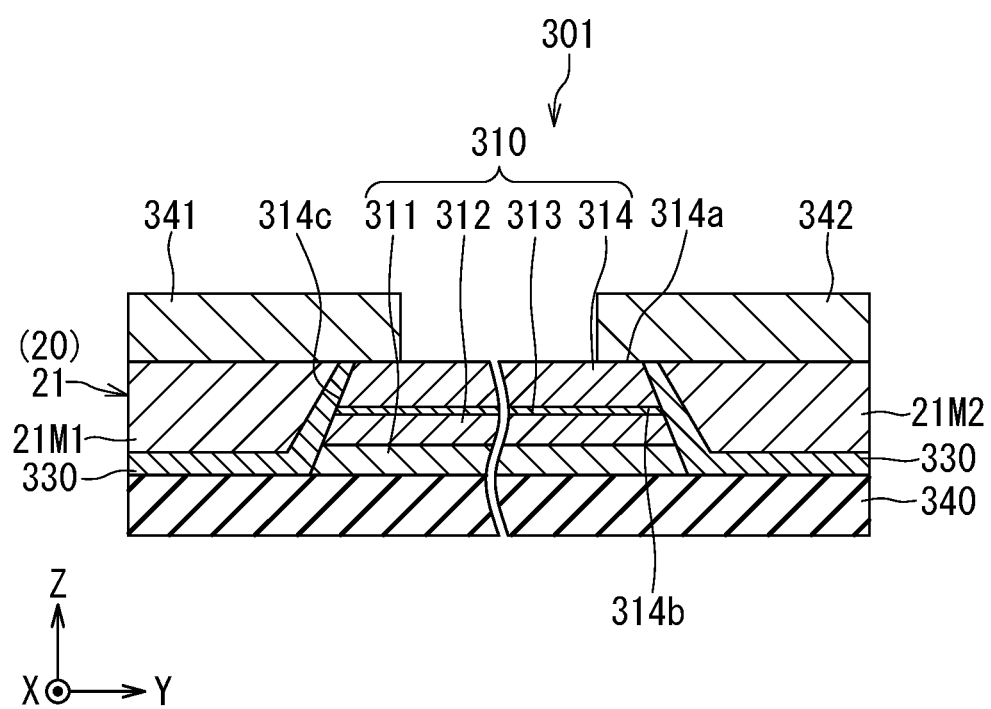
FIG. 16 is a cross-sectional view of a magnetoresistive device according to a third embodiment of the invention.

A third embodiment of the invention will now be described. First, reference is made to FIG. 16 to describe the configuration of a magnetoresistive device 301 according to the third embodiment. FIG. 16 is a cross-sectional view of the magnetoresistive device 301 according to the third embodiment. Note that FIG. 16 shows a cross section corresponding to the first cross section of the magnetoresistive device 1 according to the first embodiment (see FIG. 2).

The configuration of the magnetoresistive device 301 according to the present embodiment differs from that of the magnetoresistive device 1 according to the first embodiment in the following ways. The magnetoresistive device 301 according to the present embodiment includes an MR element 310, a nonmagnetic film 330, a first electrode 341, and a second electrode 342, in place of the MR element 10, the nonmagnetic film 30, the lower electrode 41, and the upper electrode 42 of the first embodiment, respectively. The magnetoresistive device 301 further includes an insulating layer 340.

The MR element 310 is disposed on the insulating layer 340. The MR element 310 has a bottom surface in contact with the insulating layer 340, a top surface, and a peripheral surface connecting the top and bottom surfaces.

The nonmagnetic film 330 covers a portion of the top surface of the insulating layer 340 around the MR element 310 and the peripheral surface of the MR element 310. The bias magnetic field generation unit 20 is located around the MR element 310 and lies on the nonmagnetic film 330. In the present embodiment, the nonmagnetic film 330 is specifically a nonmagnetic metal film.

The first electrode 341 is formed to extend from the top surface of the main portion 21M1 of the bias magnetic field generation unit 20 to part of the top surfaces of the nonmagnetic film 330 and the MR element 310 near the main portion 21M1. The second electrode 342 is formed to extend from the top surface of the main portion 21M2 of the bias magnetic field generation unit 20 to part of the top surfaces of the nonmagnetic film 330 and the MR element 310 near the main portion 21M2.

The MR element 310 includes an antiferromagnetic layer 311, a magnetization pinned layer 312, a gap layer 313, and a free layer 314 stacked in this order, the antiferromagnetic layer 311 being closest to the insulating layer 340. The free layer 314 has a top surface 314a and a bottom surface 314b located at opposite ends in the first direction, i.e., the Z direction, and a peripheral surface 314c connecting the top surface 314a and the bottom surface 314b. The top surface 314a corresponds to the first surface of the free layer in the present invention. The bottom surface 314b corresponds to the second surface of the free layer in the present invention.

Each of the antiferromagnetic layer 311, the magnetization pinned layer 312 and the gap layer 313 also has a top surface, a bottom surface, and a peripheral surface, like the free layer 314. The peripheral surface of the MR element 310 is constituted of the peripheral surfaces of the antiferromagnetic layer 311, the magnetization pinned layer 312, the gap layer 313, and the free layer 314. The functions of the antiferromagnetic layer 311, the magnetization pinned layer 312, the gap layer 313 and the free layer 314 are the same as those of the antiferromagnetic layer 11, the magnetization pinned layer 12, the gap layer 13 and the free layer 14 of the first embodiment, respectively.

The first electrode 341 and the second electrode 342 are intended to feed a current for magnetic signal detection to the MR element 310.

The MR element 310 is a GMR element of the current-in-plane (CIP) type in which the current for magnetic signal detection is fed in a direction generally parallel to the plane of the layers constituting the MR element 310. The gap layer 313 is a nonmagnetic conductive layer.

The bias magnetic field generation unit 20 of the present embodiment is intended to apply a bias magnetic field to the free layer 314. FIG. 16 illustrates an example in which the bias magnetic field generation unit 20 includes a ferromagnetic layer 21, which is a hard magnetic layer formed of a hard magnetic material, as in the first embodiment.

Figure 17:
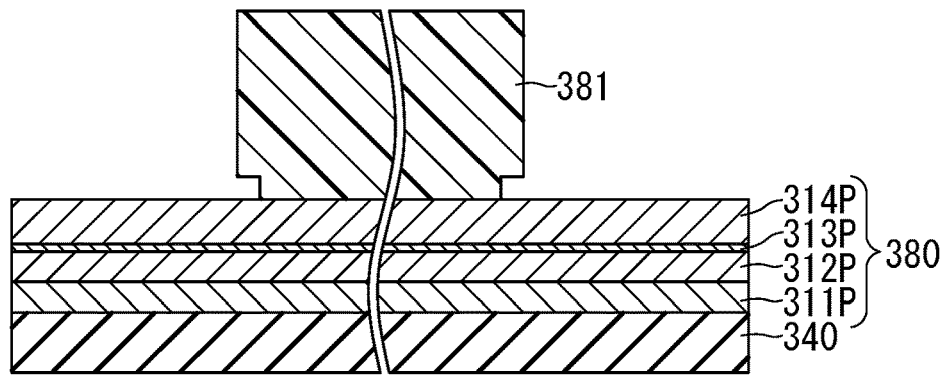
FIG. 17 is a cross-sectional view illustrating a step of a manufacturing method for the magnetoresistive device according to the third embodiment of the invention.
Figure 18:
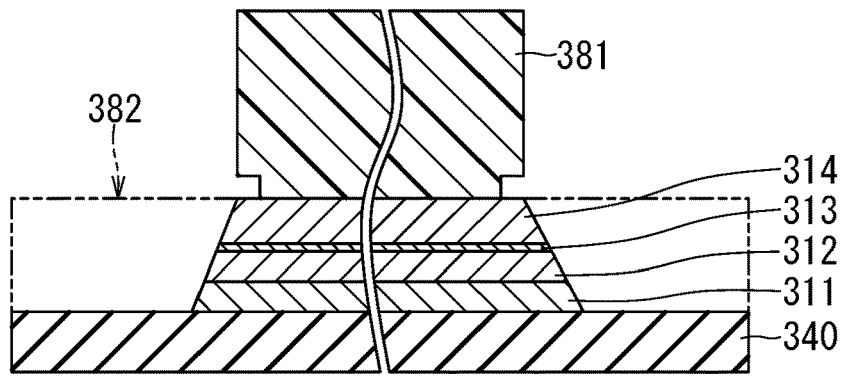
FIG. 18 is a cross-sectional view illustrating a step that follows the step of FIG. 17.
Figure 19:
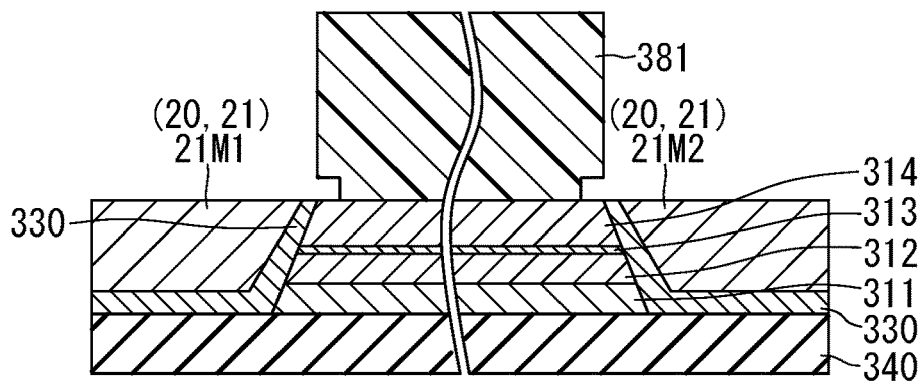
FIG. 19 is a cross-sectional view illustrating a step that follows the step of FIG. 18.

Reference is now made to FIGS. 16 to 19 to describe a manufacturing method for the magnetoresistive device 301 according to the present embodiment. FIGS. 17 to 19 each illustrate a cross section of a layered structure formed in the process of manufacturing the magnetoresistive device 301, the cross section corresponding to that shown in FIG. 16.

As shown in FIG. 17, the manufacturing method for the magnetoresistive device 301 according to the present embodiment starts with forming the insulating layer 340 on a substrate (not illustrated). Then, formed on the insulating layer 340 is a structure 380 which is to become the MR element 310 later. More specifically, an antiferromagnetic film 311P to become the antiferromagnetic layer 311, a magnetic film 312P to become the magnetization pinned layer 312, a nonmagnetic film 313P to become the gap layer 313, and a magnetic film 314P to become the free layer 314 are formed in this order on the insulating layer 340 by sputtering, for example. Then, a mask 381 to be used for patterning the structure 380 is formed on the structure 380. The mask 381 is preferably shaped to have an undercut as shown in FIG. 17 for the sake of easy removal in a later step.

FIG. 18 shows the next step. In this step, using the mask 381 as an etching mask, a portion of the structure 380 is removed by, for example, ion milling, so that the structure 380 becomes the MR element 310 and an accommodation portion 382 is formed in the structure 380.

FIG. 19 shows the next step. In this step, first, the nonmagnetic film 330, and the ferromagnetic layer 21 constituting the bias magnetic field generation unit 20 are formed in this order by, for example, sputtering over the entire top surface of the layered structure shown in FIG. 18 with the mask 381 left unremoved. The bias magnetic field generation unit 20 (the ferromagnetic layer 21) is formed in the accommodation portion 382 shown in FIG. 18. The mask 381 is then removed. Next, as shown in FIG. 16, the first and second electrodes 341 and 342 are formed on the MR element 110, the bias magnetic field generation unit 20 (the ferromagnetic layer 21) and the nonmagnetic film 330. The magnetoresistive device 301 is thereby completed.

The bias magnetic field generation unit 20 of the present embodiment may be a layered structure composed of the antiferromagnetic layer 22 and the ferromagnetic layer 21 as in the second embodiment.

The configuration, operation and effects of the present embodiment are otherwise the same as those of the first or second embodiment.

Fourth Embodiment

Figure 20:
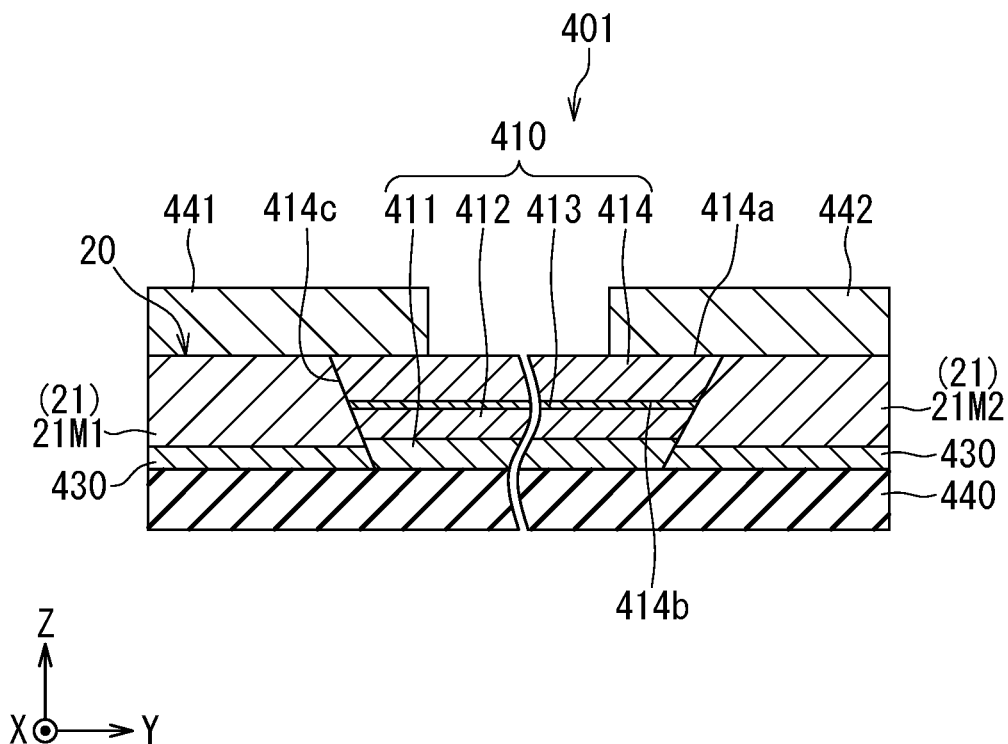
FIG. 20 is a cross-sectional view of a magnetoresistive device according to a fourth embodiment of the invention.

A fourth embodiment of the invention will now be described. First, reference is made to FIG. 20 to describe the configuration of a magnetoresistive device 401 according to the fourth embodiment. FIG. 20 is a cross-sectional view of the magnetoresistive device 401 according to the fourth embodiment. Note that FIG. 20 shows a cross section corresponding to the first cross section of the magnetoresistive device 1 according to the first embodiment (see FIG. 2).

The configuration of the magnetoresistive device 401 according to the present embodiment differs from that of the magnetoresistive device 301 according to the third embodiment in the following ways. The magnetoresistive device 401 according to the present embodiment includes an MR element 410, a first electrode 441, a second electrode 442, and an insulating layer 440, in place of the MR element 310, the first electrode 341, the second electrode 342, and the insulating layer 340 of the third embodiment, respectively. The nonmagnetic film 330 of the third embodiment is not provided in the present embodiment.

The locations of the MR element 410, the first electrode 441, the second electrode 442 and the insulating layer 440 are the same as those of the MR element 310, the first electrode 341, the second electrode 342 and the insulating layer 340 of the third embodiment, respectively. In the present embodiment, the bias magnetic field generation unit 20 is located around the MR element 410 and lies on the insulating layer 440.

The MR element 410 includes an antiferromagnetic layer 411, a magnetization pinned layer 412, a gap layer 413, and a free layer 414 stacked in this order, the antiferromagnetic layer 411 being closest to the insulating layer 440. The free layer 414 has a top surface 414$a$ and a bottom surface 414$b$ located at opposite ends in the first direction, i.e., the Z direction, and a peripheral surface 414$c$ connecting the top surface 414$a$ and the bottom surface 414$b$. The top surface 414$a$ corresponds to the first surface of the free layer in the present invention. The bottom surface 414$b$ corresponds to the second surface of the free layer in the present invention.

Each of the antiferromagnetic layer 411, the magnetization pinned layer 412 and the gap layer 413 also has a top surface, a bottom surface, and a peripheral surface, like the free layer 414. The peripheral surface of the MR element 410 is constituted of the peripheral surfaces of the antiferromagnetic layer 411, the magnetization pinned layer 412, the gap layer 413, and the free layer 414. The functions of the antiferromagnetic layer 411, the magnetization pinned layer 412, the gap layer 413 and the free layer 414 are the same as those of the antiferromagnetic layer 11, the magnetization pinned layer 12, the gap layer 13 and the free layer 14 of the first embodiment, respectively.

The first electrode 441 and the second electrode 442 are intended to feed a current for magnetic signal detection to the MR element 410.

The MR element 410 is a GMR element of the CIP type. The gap layer 413 is a nonmagnetic conductive layer.

The bias magnetic field generation unit 20 of the present embodiment is intended to apply a bias magnetic field to the free layer 414. In the present embodiment, the bias magnetic field generation unit 20 includes an underlying film 430 and a ferromagnetic layer 21 stacked in this order on the insulating layer 440. The ferromagnetic layer 21 is a hard magnetic layer formed of a hard magnetic material, as in the first embodiment. The underlying film 430 is formed of a nonmagnetic metal material.

Figure 21:
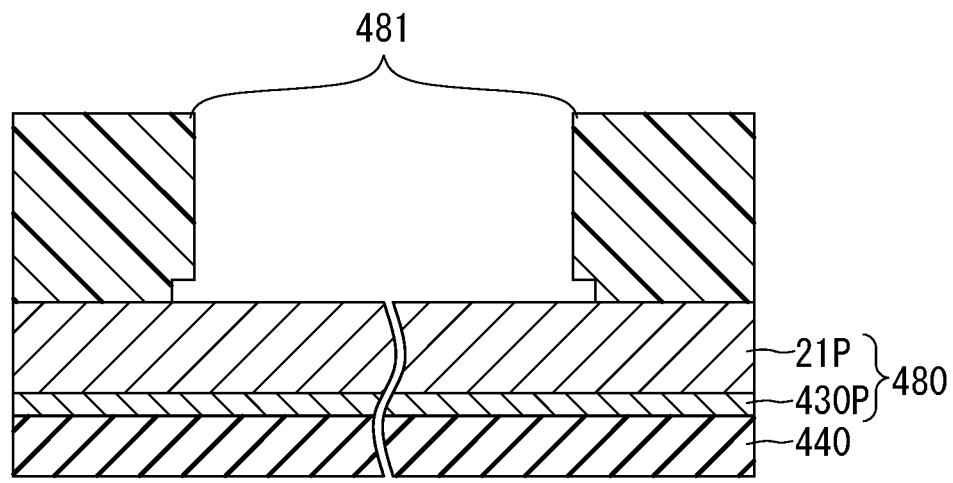
FIG. 21 is a cross-sectional view illustrating a step of a manufacturing method for the magnetoresistive device according to the fourth embodiment of the invention.
Figure 22:
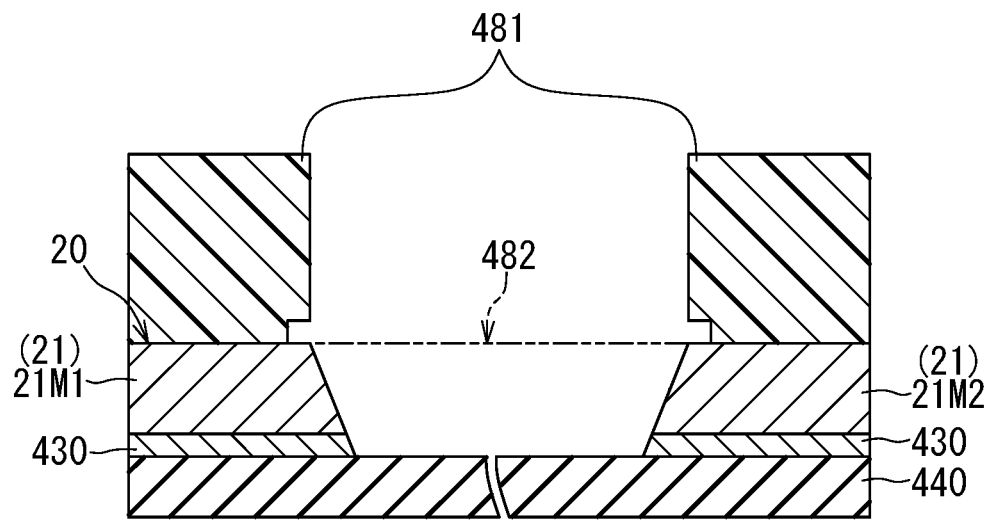
FIG. 22 is a cross-sectional view illustrating a step that follows the step of FIG. 21.
Figure 23:
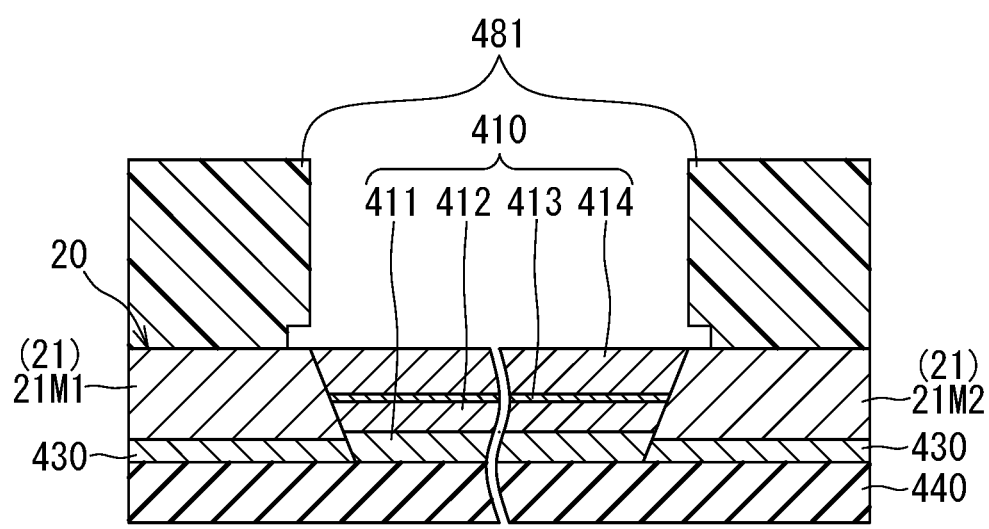
FIG. 23 is a cross-sectional view illustrating a step that follows the step of FIG. 22.

Reference is now made to FIGS. 20 to 23 to describe a manufacturing method for the magnetoresistive device 401 according to the present embodiment. FIGS. 21 to 23 each illustrate a cross section of a layered structure formed in the process of manufacturing the magnetoresistive device 401, the cross section corresponding to that shown in FIG. 20.

As shown in FIG. 21, the manufacturing method for the magnetoresistive device 401 according to the present embodiment starts with forming the insulating layer 440 on a substrate (not illustrated). Then, formed on the insulating layer 440 is a structure 480 which is to become the bias magnetic field generation unit 20 later. More specifically, a nonmagnetic metal film 430P to become the underlying film 430 and a magnetic layer 21P to become the ferromagnetic layer 21 are formed in this order on the insulating layer 440. Then, a mask 481 to be used for patterning the structure 480 is formed on the structure 480. The mask 481 is preferably shaped to have an undercut as shown in FIG. 21 for the sake of easy removal in a later step.

FIG. 22 shows the next step. In this step, using the mask 481 as an etching mask, a portion of the structure 480 is removed by, for example, ion milling, so that the structure 480 becomes the bias magnetic field generation unit 20 and an accommodation portion 482 is formed in the structure 480.

FIG. 23 shows the next step. In this step, the MR element 410 is formed in the accommodation portion 482 shown in FIG. 22. More specifically, first, the antiferromagnetic layer 411, the magnetization pinned layer 412, the gap layer 413, and the free layer 414 are formed in this order by, for example, sputtering over the entire top surface of the layered structure shown in FIG. 22 with the mask 481 left unremoved. The mask 481 is then removed. Next, as shown in FIG. 20, the first and second electrodes 441 and 442 are formed on the MR element 410 and the bias magnetic field generation unit 20 (the ferromagnetic layer 21). The magnetoresistive device 401 is thereby completed.

The bias magnetic field generation unit 20 of the present embodiment may be a layered structure composed of the antiferromagnetic layer 22 and the ferromagnetic layer 21 as in the second embodiment. In the present embodiment, the layered structure is located on the underlying film 430.

The configuration, operation and effects of the present embodiment are otherwise the same as those of the second or third embodiment.

The present invention is not limited to the foregoing embodiments, and various modifications may be made thereto. For example, the magnetoresistive elements in the present invention are not limited to those configured as illustrated in the foregoing embodiments but can be any magnetoresistive elements that each include a free layer whose magnetization direction is variable by a magnetic field applied thereto.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetoresistive device comprising a magnetoresistive element and a bias magnetic field generation unit, wherein:
the magnetoresistive element includes a free layer having a magnetization whose direction is variable by a magnetic field applied thereto,
the bias magnetic field generation unit includes a ferromagnetic layer for generating a bias magnetic field to be applied to the free layer,
the free layer has a first surface and a second surface located at opposite ends in a first direction, and a peripheral surface connecting the first surface and the second surface,
the first surface is shaped to be longer in a second direction orthogonal to the first direction than in a third direction orthogonal to the first direction and the second direction,
the ferromagnetic layer includes one or two main portions, a first side portion, and a second side portion,
the one or two main portions are separated from the first side portion and the second side portion in a direction around a perimeter of the free layer,
in a first cross section passing through a centroid of the first surface and parallel to the first and second directions, the one or two main portions are located on one side or opposite sides of the free layer in the second direction,
in a second cross section passing through the centroid of the first surface and perpendicular to the second direction, the first side portion and the second side portion are located on opposite sides of the free layer in the third direction,
the one or two main portions have a larger dimension in the third direction than the free layer, and
in the second cross section, a shortest distance between the peripheral surface of the free layer and the first side portion and a shortest distance between the peripheral surface of the free layer and the second side portion are 35 nm or less.

2. The magnetoresistive device according to claim 1, wherein in any cross section intersecting the free layer and perpendicular to the second direction, the shortest distance between the peripheral surface of the free layer and the first side portion and the shortest distance between the peripheral surface of the free layer and the second side portion are 35 nm or less.

3. The magnetoresistive device according to claim 1, wherein in the second cross section, the shortest distance between the peripheral surface of the free layer and the first side portion and the shortest distance between the peripheral surface of the free layer and the second side portion are 20 nm or less.

4. The magnetoresistive device according to claim 1, wherein:
the magnetoresistive element further includes a magnetization pinned layer having a magnetization in a predetermined direction, and a gap layer disposed between the magnetization pinned layer and the free layer, and
the magnetization pinned layer, the gap layer and the free layer are stacked in the first direction.

5. The magnetoresistive device according to claim 1, further comprising a nonmagnetic film separating the free layer from the ferromagnetic layer.

6. The magnetoresistive device according to claim 5, wherein in the second cross section, the shortest distance between the peripheral surface of the free layer and the first side portion and the shortest distance between the peripheral surface of the free layer and the second side portion are in the range of 1 to 20 nm.

7. The magnetoresistive device according to claim 1, wherein:
the one or two main portions are two main portions, and the two main portions, the first side portion and the second side portion partially surround the perimeter of the free layer as viewed in a direction from the first surface to the second surface of the free layer.

8. The magnetoresistive device according to claim 1, wherein the bias magnetic field is in the second direction.

9. The magnetoresistive device according to claim 1, wherein the bias magnetic field is in a direction that forms an acute angle with respect to the second direction.

10. The magnetoresistive device according to claim 1, wherein the bias magnetic field generation unit further includes an antiferromagnetic layer configured to be exchange-coupled with the ferromagnetic layer.

* * * * *